(12) United States Patent
Kuriyama et al.

(10) Patent No.: US 6,416,638 B1
(45) Date of Patent: Jul. 9, 2002

(54) POWER SUPPLY UNIT FOR SPUTTERING DEVICE

(75) Inventors: Noboru Kuriyama, Yokohama; Yutaka Yatsu, Sagamihara; Yoshio Kawamata; Takashi Fujii, both of Zama, all of (JP)

(73) Assignee: Shibaura Mechatronics Corporation, KAnagawa-ken (JP)

( * ) Notice: Subject to any disclaimer, the term of this patent is extended or adjusted under 35 U.S.C. 154(b) by 0 days.

(21) Appl. No.: 09/355,492

(22) PCT Filed: Feb. 19, 1998

(86) PCT No.: PCT/JP98/00693

§ 371 (c)(1),
(2), (4) Date: Jul. 28, 1999

(87) PCT Pub. No.: WO98/37257

PCT Pub. Date: Aug. 27, 1998

(30) Foreign Application Priority Data

Feb. 20, 1997 (JP) .............................................. 9-036248

(51) Int. Cl.[7] .............................................. C23C 14/34
(52) U.S. Cl. .............................. 204/298.08; 204/298.03; 204/192.13
(58) Field of Search ....................... 204/192.12, 192.13, 204/298.03, 298.08

(56) References Cited

U.S. PATENT DOCUMENTS

| | | | | |
|---|---|---|---|---|
| 5,241,152 A | * | 8/1993 | Anderson et al. ....... | 204/298.08 |
| 5,286,360 A | * | 2/1994 | Szczyrbowski et al. .................... | 204/298.08 |
| 5,303,139 A | * | 4/1994 | Mark .................... | 204/298.08 |
| 5,427,669 A | * | 6/1995 | Drummond ............ | 204/298.08 |
| 5,576,939 A | | 11/1996 | Drummond .................. | 363/16 |
| 5,584,972 A | * | 12/1996 | Lantsman ............... | 204/192.12 |
| 5,660,700 A | * | 8/1997 | Shimizu et al. ......... | 204/298.08 |
| 5,718,813 A | | 2/1998 | Drummond et al. ... | 204/192.12 |
| 6,001,224 A | | 12/1999 | Drummond et al. ... | 204/192.12 |
| 6,024,844 A | | 2/2000 | Drummond et al. ... | 204/192.12 |

FOREIGN PATENT DOCUMENTS

| | | | |
|---|---|---|---|
| JP | 2194831 | 8/1990 | ............ B01J/19/08 |
| JP | 5311418 | 11/1993 | ............ C23C/14/34 |
| JP | 7233472 | 9/1995 | ............ C23C/14/34 |
| JP | 841636 | 2/1996 | ............ C23C/14/34 |
| JP | 9137271 | 5/1997 | ............ C23C/14/34 |
| JP | 2835323 | 10/1998 | ............ C23C/14/34 |

OTHER PUBLICATIONS

US 5,863,392, 01/1999, Drummmond et al. (withdrawn)

* cited by examiner

Primary Examiner—Rodney G. McDonald
(74) Attorney, Agent, or Firm—Volpe and Koenig, P.C.

(57) ABSTRACT

The present invention is such that, in a circuit for preventing an arc discharge through the application of a reverse voltage pulse, in the case where, after the application of the reverse voltage pulse has been ended, the generation of an arc discharge is detected by an arc discharge detecting means (23), a reverse voltage generated by a reverse voltage generating means (12) is applied within 1 to 10 μs to a sputtering source to lower the probability of generating a continuous arc discharge and, through a diode (D10) connected in series with the sputtering source (14) and a resistor (r10) connected in parallel with the diode (D10), a current at a time of applying the reverse voltage is restricted, thus lowering a continuous arc discharge resulting from the reverse arc discharge.

23 Claims, 4 Drawing Sheets

POWER SUPPLY UNIT FOR SPUTTERING DEVICE

TECHNICAL FIELD

The present invention relates to a power supply device for a sputtering apparatus for forming a thin film on an electronic component, semiconductor, optical disk, etc.

BACKGROUND ART

The technique for forming a thin film on a semiconductor, electronic component, decorated component, etc., by means of a sputtering apparatus using a sputtering source arranged with a magnet placed at a rear surface of a target has been extensively used. In such a sputtering apparatus, an inert gas, such as Ar, is introduced as a discharge gas in a vacuum chamber with a sputtering source placed therein and, by applying a negative voltage to the sputtering source, a magnetron discharge is generated, causing the ionization of the discharge gas introduced in the vacuum container, the acceleration of positive ions of ionized argon and the subsequent collision of these against the target surface of the sputtering source, so that the target surface is evaporated through the sputtering. The sputtering particles are deposited on a substrate and a thin film is formed which is made up of the target material. This is called a sputtering.

In the course of the sputtering, there is sometimes the case that the magnetron discharge is changed to an arc discharge. If, in this case, the magnetron discharge is changed to the arc discharge, it is not possible to effect such sputtering.

Therefore, such a reverse voltage pulse as to maintain the above-mentioned sputtering source somewhat briefly at a positive potential is applied immediately after the generation of the arc discharge, thus suppressing the generation of the arc discharge.

In this prior art case, the time interval in which this reverse voltage pulse was applied was 30 µs or more.

Incidentally, the time interval in which the reverse voltage pulse was applied was required to have a time interval of a given value because a problem arises such as to protect a switching element from being destroyed due to a power loss involved.

As set out above, even if a reverse voltage pulse is applied in a time interval of 30 µs or more, there sometimes occurs a subsequently immediate continuous arc discharge. There was a problem with a high probability of the occurrence of a continuous arc discharge.

Further, in the case where the reverse voltage pulse is applied, a positive voltage may be applied to the sputtering source and there also occurs on arc discharge in a reverse direction, for example, from a substrate, etc. When a continuous arc discharge has been produced due to a reverse arc discharge, there was a problem of causing damage to the substrate.

Disclosure of Invention

The present invention is achieved with the above-mentioned points in view and its object is to provide a power supply device for a sputtering apparatus which, in order to prevent the generation of a continuous arc discharge, sets a time interval of the application of a reverse voltage pulse to be within 1 to 10 µs in the case where the generation of the arc discharge is detected and can positively prevent the generation of a reverse arc discharge resulting from the reverse voltage pulse.

According to one embodiment of the present invention there is provided a power supply device for a sputtering apparatus introducing an inert gas into a grounded vacuum container, applying a negative voltage to a sputtering source located in the vacuum container and effecting sputtering, the power supply device being characterized by comprising a DC current power supply for applying a DC voltage to the sputtering source; reverse voltage generating means for applying a reverse voltage to the sputtering source so as to stop generation of an arc discharge in the sputtering, switching means for enabling the reverse voltage which is generated at the reverse voltage generating means to be applied to the sputtering source; arc discharge detecting means for detecting the generation of the arc discharge in the vacuum container; reverse voltage applying means for, when the generation of the arc discharge is detected by the arc discharge detecting means, turning the switching means ON for a set time and for enabling a reverse voltage generated from the voltage generating means to be applied to the sputtering source; and reverse voltage application control means for, when the generation of the arc discharge is detected by the arc discharge detecting means, applying the reverse voltage generated by the reverse voltage generating means to the sputtering source for a set time and, when generation of an arc discharge is again detected by the arc discharge detecting means after that application, applying the reverse voltage which is generated by the reverse voltage generating means to be applied to the sputtering source in a range of 1 to 10 µs.

Since the interval at which the reverse voltage pulse is applied is set to be below 1 to 10 µs, it is possible to extremely lower the generation probability of a continuous arc discharge.

BEST MODE OF CARRYING OUT THE INVENTION

Figure 1:
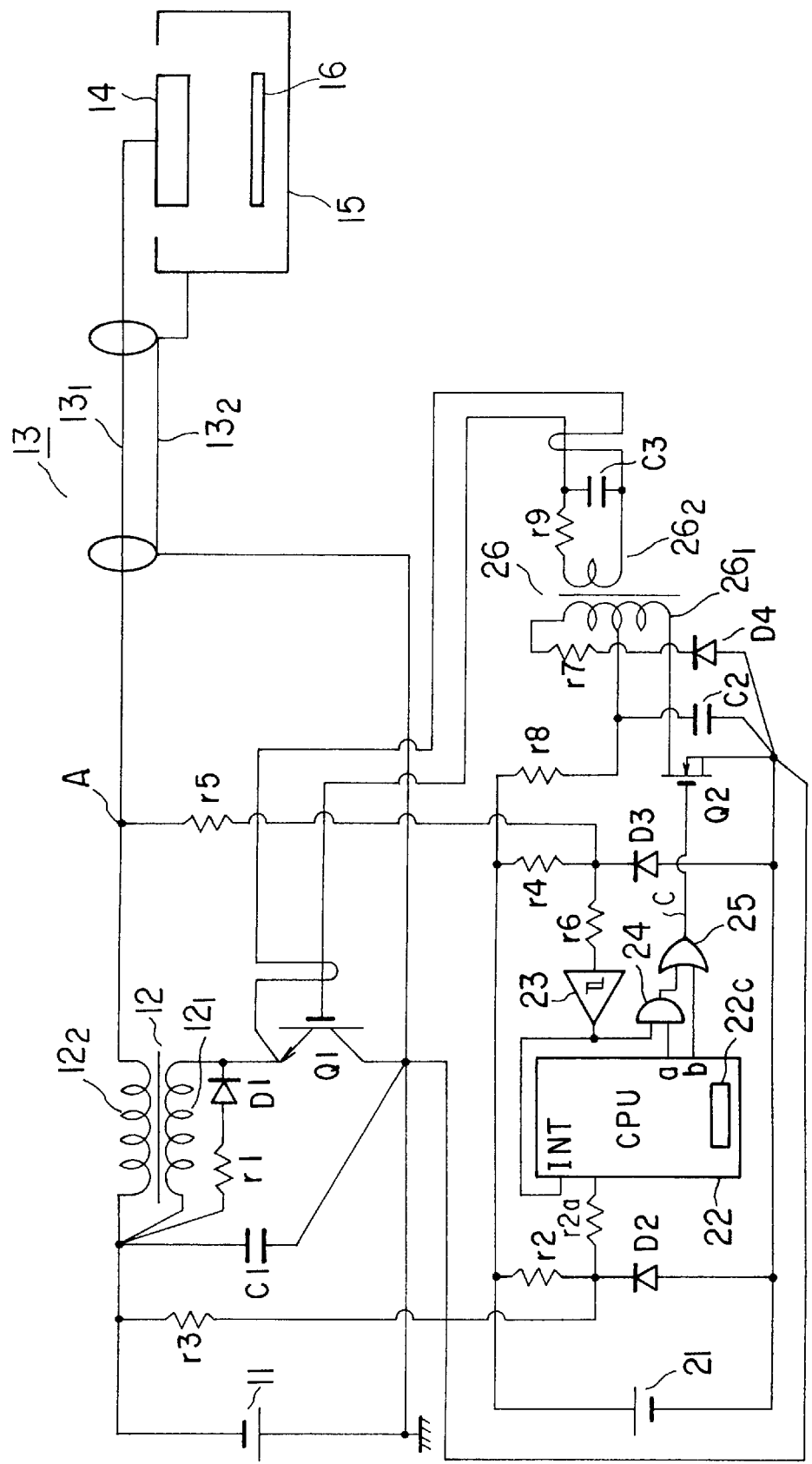
FIG. 1 is a circuit diagram showing a power supply device, for a sputtering apparatus, according to a first embodiment of the present invention.

A first embodiment of the present invention will be explained below with reference to the accompanying drawing. FIG. 1 is a circuit diagram showing a power supply device for a sputtering apparatus. In this Figure, 11 shows a DC power supply for a sputtering apparatus which is, for example, 800V. The negative electrode of the DC power supply 11 is connected to one input terminal sides of a primary coil $12_1$ and secondary coil $12_2$ in a pulse transformer 12 serving as a reverse voltage generating means. The turn ratio of the primary coil $12_1$ and secondary coil $12_2$ is set to be 1:1.1: to 1:1.3.

The other end of the primary coil $12_1$ is connected to the emitter of a transistor Q1 serving as a switching means. The collector of the transistor Q1 is connected to a positive electrode 11 of the DC power supply 11.

Further, a series connected circuit of a resistor r1 and diode D1 is connected in parallel between both terminals of the primary coil $12_1$. The resistor r1 is used for surge absorption and the diode D1 is used for fly wheel.

A capacitor C1 of a large capacity is connected in parallel between the one end of the primary coil $12_1$ and the collector of the transistor Q1 (or between both the electrodes of the DC power supply 11). Thus, a voltage equal to the power supply 11 is charged across the capacitor C1.

The other-end side of the secondary $12_2$ is connected to a sputtering source 14 through one line $13_1$ of an output cable 13.

Further, 15 shows a vacuum chamber arranged at the sputtering source 14. Within the vacuum container 15 a substrate 16 is placed in a position opposite to a target of the sputtering source 14. An inert gas, such as an argon gas, is introduced in the vacuum container 15.

21 shows a DC power supply for a control circuit. A series-connected circuit of a resistor r2 and reversely-connected diode D2 is connected in parallel between both electrodes of the DC power supply 21 for the control circuit. A resistor r3 is connected between the negative electrode of the DC power supply and a connection point of resistor r2 and diode D2.

Further, a connection point between the resistor r2 and the diode D2 is connected to a signal input terminal of a CPU 22 (central processing unit) for control through a resistor r2a. A counter 22c for time count processing is contained in a CPU 22.

A series-connected circuit of a resistor r4 and reversely-connected diode D3 is connected between both electrodes of the DC power supply 21.

One point A on a line connecting the other-end side of the secondary coil of the pulse transformer 12 to one end of the one line $13_1$ of the output cable 13 is connected through a resistor r5 to a connection point of the resistor r4 and diode D3.

The connection point of the resistor r4 and diode D3 is connected to the input of a Schmitt trigger circuit 23 through a resistor r6. When a voltage on a point A falls, the Schmitt trigger circuit 23 has its output varied from a "0" level to a "1" level. This is because, if an arc discharge occurs in the vacuum container 15, a voltage on the point A falls. An arc discharge detecting means is constituted by a Schmitt trigger circuit 23.

The output of the Schmitt trigger circuit 23 is input to an interrupt terminal INT of the CPU 22 and to one input terminal of an AND circuit 24. A gate control signal a from the CPU 22 is input to the other input terminal of the AND circuit 24.

A control signal b of the CPU 22 is input to one input terminal of an OR circuit 25 and an output of the AND circuit 24 is input to the other input terminal of the OR circuit 25. The gate control signal a is generated in a normal state as a "1" level output and the control signal b is generated in a normal state as a "0" level output.

An output signal c of the OR gate 25 delivers as a "1" level output when a reverse voltage pulse, the output signal c of the OR gate 25 delivers as a "0" level output when-no reverse voltage is output.

The output signal c of the OR circuit 25 is input to the gate of a switching FETQ2. The source of the FETQ2 is connected to a negative polarity of the DC power supply 21.

Further, the source of the FETQ2 is connected through a diode D4 and resistor r7 to one terminal of a primary coil $26_1$ of a pulse transformer 26. The other terminal of the primary coil $26_1$ is connected to the drain of the FETQ2.

The positive polarity of the DC power supply 21 is connected to the source of FETQ2 through a resistor r8 and capacitor C2.

A connection point between the resistor r8 and capacitor C2 is connected to an intermediate point of the primary coil $26_1$.

Across both terminals of a secondary coil $26_2$ of a transformer 26 a resistor r9 is connected in series and a capacitor C3 is connected in parallel.

And one end of the capacitor C3 is connected to the base of the transistor Q1 and the other end of the capacitor C3 is connected to the emitter of the transistor Q1.

The positive electrode of the DC power supply 11 is grounded and the other line $13_2$ (grounded side) of the output cable 13 is connected to a body of the vacuum chamber 15.

The operation of the first embodiment thus structured will be explained below. First the vacuum chamber 15 is evacuated by a vacuum pump not shown. An Ar gas pulse is conducted into the vacuum chamber 15 and a negative voltage of the DC power supply 11 is applied to the sputtering power 14, thus generating a magnetron discharge. Through the magnetron discharge an argon plasma is created in a charge space. Argon positive ions in this plasma are accelerated through a negative voltage difference and collide with the surface of a target on the sputtering source 14. Through the collision, aluminum atoms of the target are evaporated. And parts of the sputter-evaporated aluminum atoms are deposited on the substrate 16 to form an aluminum thin film through the sputter-evaporation.

And unless the magnetron discharge generated within the vacuum chamber 15 is transferred to an arc discharge, the sputter-evaporation is continued.

Figure 2A:
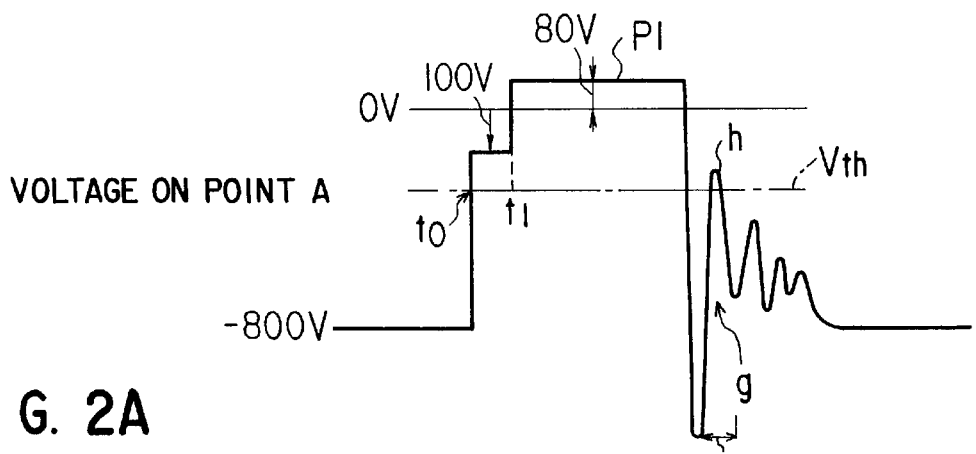
FIGS. 2A to 2F are timing charts for explaining an operation of the present invention.

When the magnetron discharge generated in the vacuum chamber 15 is transferred to the arc discharge, a voltage on the point A falls as shown in FIG. 2A. The voltage on the point A appears as an output voltage-divided through the resistors r5 and r4 and this output is input through a resistor r6 to the Schmitt trigger circuit 23. Therefore, the Schmitt trigger circuit 23 outputs a "0" level, when a voltage on the point A for example exceeds 300V, and a "1" level to the interrupt terminal INT of the CPU 22, when a voltage on the point A is below 150V, and also outputs a corresponding one to the AND circuit 24. The gate control signal a input to the other input terminal of the AND circuit 24 is received as the "1" level in the normal state and the output of the AND circuit 24 rises to a "1" level. This signal is supplied through the OR circuit 25 to the gate of the FETQ2. For this reason, the FETQ2 is turned ON.

And a pulse voltage is applied to the primary coil $26_1$ of the pulse transformer 26 and a pulse voltage output from the secondary coil $26_2$ is applied to the gate of the transistor Q1.

The voltage the same as that of the DC power supply 11 that is, that charged in the capacitor C1, is applied to the primary coil $12_1$ of the transformer 12 and, assuming that the turn ratio of the primary coil $12_1$ and secondary coil $12_2$ in the transformer 12 is 1:1.1, a voltage of 1.1E (E: a voltage of the DC power supply 11) is generated in the secondary coil $12_2$ of the transformer 12.

Therefore, a positive voltage of 0.1E is applied to the sputtering source 14. That is, the reverse voltage pulse p1 is applied from a time t1.

Through the application of the reverse voltage pulse p1, the sputtering source 14 is maintained to a positive voltage and an arc discharge disappears.

Figure 2B:
Figure 2C:
Figure 2D:
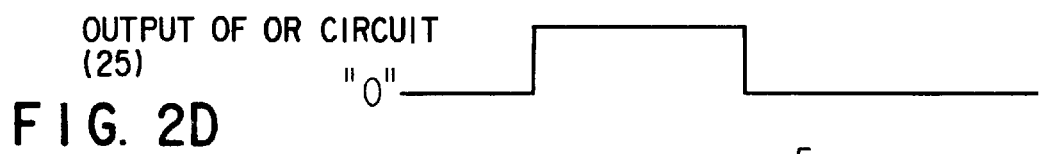
Figure 2E:
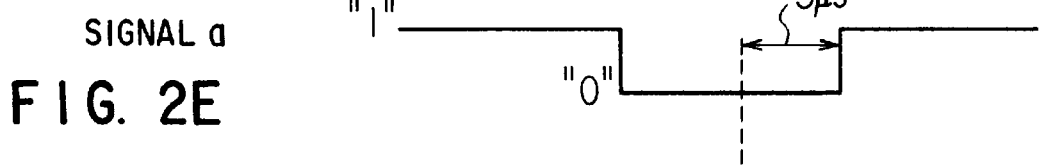

Through a divided voltage on the junction of the resistors r3, r2 the CPU 22 determines that a voltage of the DC power supply 11 exceeds, for example, 300V and, if it is determined that is exceeds 300V, the CPU 22 outputs a gate control signal a as a "1" level (FIG. 2E). If, on the other hand, it is determined that the voltage is below 300V, the CPU delivers the gate control signal a as a "0" level output.

Further, the CPU 22 detects the generation of an arc discharge by monitoring a voltage on the point A. The voltage on the point A reveals above 300V at a normal discharge time and becomes below 150V at an arc discharge time.

The Schmitt trigger circuit compares a voltage on the connection point of the resistors r4, r5, which is obtained by dividing the voltage on the point A, with an internal operation voltage and, if any arc discharge occurs, delivers a "1" level output because the voltage on the connection point A for example becomes below 150V and delivers a "0" level output when it exceeds 300V. As a result, at time t0 when the arc discharge occurs, the Schmitt trigger circuit 23 delivers the "1" level output to the INT of the CPU 22 as shown in FIG. 2B.

When the output of the Schmitt trigger circuit 23 becomes a "1" level, the gate control signal a becomes a "1" level and the AND circuit 24 is Added. For this reason, in spite of the output level of the control signal b, the output signal c of the OR circuit 25 becomes a "1" level (FIG. 2D).

Since the output signal c of the OR circuit 25 is input to the gate of the FETQ2, the FETQ2 is turned ON.

When the FETQ2 is turned ON, the pulse transformer 26 is magnetically excited. As a result, the pulse voltage on the secondary coil $26_2$ of the pulse transformer 26 is output to the base of the transistor Q1 and the transistor Q1 is turned ON. By doing so, a reverse voltage pulse p1 is output from the pulse transformer 12 (reverse voltage application means).

Here, since either of the pulse transformers 26 and 12 cannot transmit a signal by a determined voltage·time product (ET product), it is necessary to stop the gate driving of the FETQ2 before reaching the voltage·time product and effect a transfer to a reset operation. That is, the voltage on the connection point A is below a decision level of the Schmitt circuit 23 and it is, therefore, necessary to cause a pulse operation with the use of the CPU 22.

First, the CPU 22 resets the counter 22c in synchronism with a rise of the "1" signal from the Schmitt trigger circuit 23 and, at the same time, effects interrupt processing.

In the interrupt processing, the CPU 22 sets the gate control signal a to "0" (time t2) after setting the signal b to a "1". By setting the gate control signal a to the "0", the gate of the AND circuit 24 is closed and the voltage on the point A and gate driving of the FETQ2 have no relevancy.

A set time T after time t0 at which the counter 22 starts time count processing, the signal b falls to a "0" (time t3).

When the signal b falls to a "0", the two input signals of the OR circuit 25 are at the "0" levels and the FETQ2 is turned OFF.

When the FETQ2 is turned OFF, a current flowing through the primary coil $26_1$ of the pulse transformer 26 is flowed back to the capacitor C2 through the fly wheel diode D4, resistor r7 and coil $26_1$, so that a reverse voltage is generated in the secondary coil $26_2$. As a result, the gate voltage of the-transistor Q1 is reversed and the transistor Q1 is turned OFF.

When the transistor Q1 is turned OFF, a current flowing through the primary coil $12_1$ of the pulse transformer 12 is circulated through the fly wheel diode D1, resistor r1 and primary coil $12_1$.

Since a voltage on the primary side of the pulse transformer 12 is inverted, a voltage on the secondary side is inverted and the voltage on the point A becomes a sputtering voltage (over 300V). At this time, through a straight capacity and inductance of the circuit, the voltage on the point A oscillates by about 2 μs as shown in FIG. 2A.

Figure 2F:
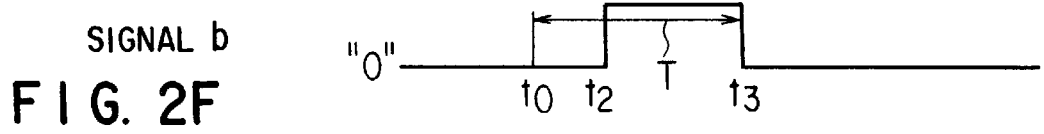

By setting a time from the falling of the signal b to the "0" level to the rising of the gate control signal a to the "1" level to be 5 μs, for example, as shown in FIG. 2F, an erroneous operation is prevented.

When the setting time is counted by the counter 22c, the gate control signal a is made to rise to a "1" level as shown in FIG. 2E.

During 5 μs from time t3 at which the output of the OR circuit 25 falls, the gate control signal a is set to the "0" level (reverse voltage application control means). And even if a signal h exceeding a threshold value Vth is generated through the oscillation g of the voltage on the point A following the falling of the output of the OR circuit 25 there is no erroneous decision on the occurrence of an arc discharge.

That is, even if the output of the Schmitt trigger circuit 23 is changed toga "1" level through the oscillation g, the gate control signal a is set to a "0" level, so that the FETQ2 is not rendered ON.

The problem with the operation of this circuit lies in that the transformer serves as such by a voltage·time product determined by the use of the transformer. Unless the reverse voltage is applied to the transformer before reaching the voltage·time product and the magnetized state of an iron core is reset, it is not possible to apply the next pulse voltage.

This resetting circuit comprises the resistor r1 and diode D1 for the pulse transformer 26 and the diode D4 and resistor r7 for the pulse transformer 26. Since the higher the reverse voltage applied the quicker the resetting time, it is possible to briefly set an ON time of the transistor Q2 by selecting the resistor r7 to a greater value of below a gate withstand voltage of the transistor Q1 in the case of the pulse transformer 26. In the case of the transformer 12, the greater voltage·current is handled and, if the resistor r1 is made greater, the transistor Q1 exceeds its withstand voltage. If consideration is paid to only the withstand voltage of the transistor, this countermeasure is to connect a plurality of transistors in a serial array. However, a voltage on the sputtering source 14 becomes momentarily greater and a resetting time has been secured in the prior art with a control circuit for applying a reverse voltage to block the arc discharge. This reset time was a rest period of over 30 μs.

In actual practice, however, it has been proved that, if sputtering is effected with the conventional circuit, an arc discharge is normally adequately suppressed but sometimes not so. That is, it has been proved that 1. When a longer time is taken from the generation of an arc discharge up to a reverse voltage pulse, the arc discharge is grown and, even after the ending of the reverse voltage pulse, it stays as a continuous arc discharge.

2. When the rest time from the ending of the reverse voltage pulse to the appearance of the next pulse is shortened, an effect is revealed from about 15 μs and, at a time of below 5 μs, unless a reverse arc discharge occurs, no arc discharge occurs immediately after the ending of a reverse voltage pulse.

3. In this case, the transformer 26 is operable, without being magnetically saturated, by optimizing the resistor r7, but it has been considered that the transformer 12 never works as it is, but that 4. It is only in the case of a continuous arc discharge that the resetting time cannot be taken and, by inserting a reverse arc discharge preventing circuit to cease the generation of a continuous arc discharge corresponding to above 2 pulses and designing the voltage·time product of the transformer 12 to be over four pulses, it is possible to use the transformer 12 without being magnetically saturated.

Considered from the electric circuit standpoint, it is truly reasonable to, as in the prior art, secure a resetting time for resetting the voltage·time product of the transformer. In the case of the arc discharge preventing circuit, however, the effect of the reverse voltage pulse will change depending upon at what timing the arc discharge occurs with aspect to the rest time. Since the reverse voltage pulse does not work from after the arc discharge has grown large, the generation of the continuous arc discharge is better suppressed by making the rest time shorter and, as a result, it has been possible to secure the resetting time.

Two cases are considered from for the generation of the continuous arc discharge. In the case where the effect of the reverse voltage pulse ceases to exist due to the occurrence of a grown arc discharge and in the case where a reverse arc discharge occurs due to an arc discharge generated with a reverse voltage when a reverse voltage pulse is applied, it follows that, after the ending of the reverse voltage pulse, a forward arc discharge will occur in almost cases. The continuous arc discharge in the case of a shorter rest period is caused by the reverse arc discharge, so that it is possible to prevent the continuous arc discharge by preventing the reverse arc discharge.

The reverse arc discharge is prevented by the following methods:

1. The reverse voltage is lowered.

a) The turn ratio of the transformer changes.

b) A current flows in parallel in the sputter source. A voltage is restricted using a resistive value and zener diode.

2. A current flowing at a time of applying a reverse current is restricted.

c) For a forward current a diode is properly selected and for a current of a reverse arc discharge a resistive value is properly selected.

Stated in more detail, for the forward direction, a low impedance is connected to allow the flowing of a current of a sputtering discharge and an impedance higher than that impedance is connected in parallel to prevent a reverse arc current.

d) A current limiting circuit is inserted as an impedance with a bipolar transistor, IGBT, MOSFET, etc. This time, the impedance of the reverse arc discharge was about 1 Ω and an impedance not created in a reverse direction time was 200 Ω and, with a resistive value set to 100Ω, an effect obtained was outstanding. It is to be noted that, with the resistor of 100 106, this resistor is used in a second embodiment as will be set out below.

Figure 3:
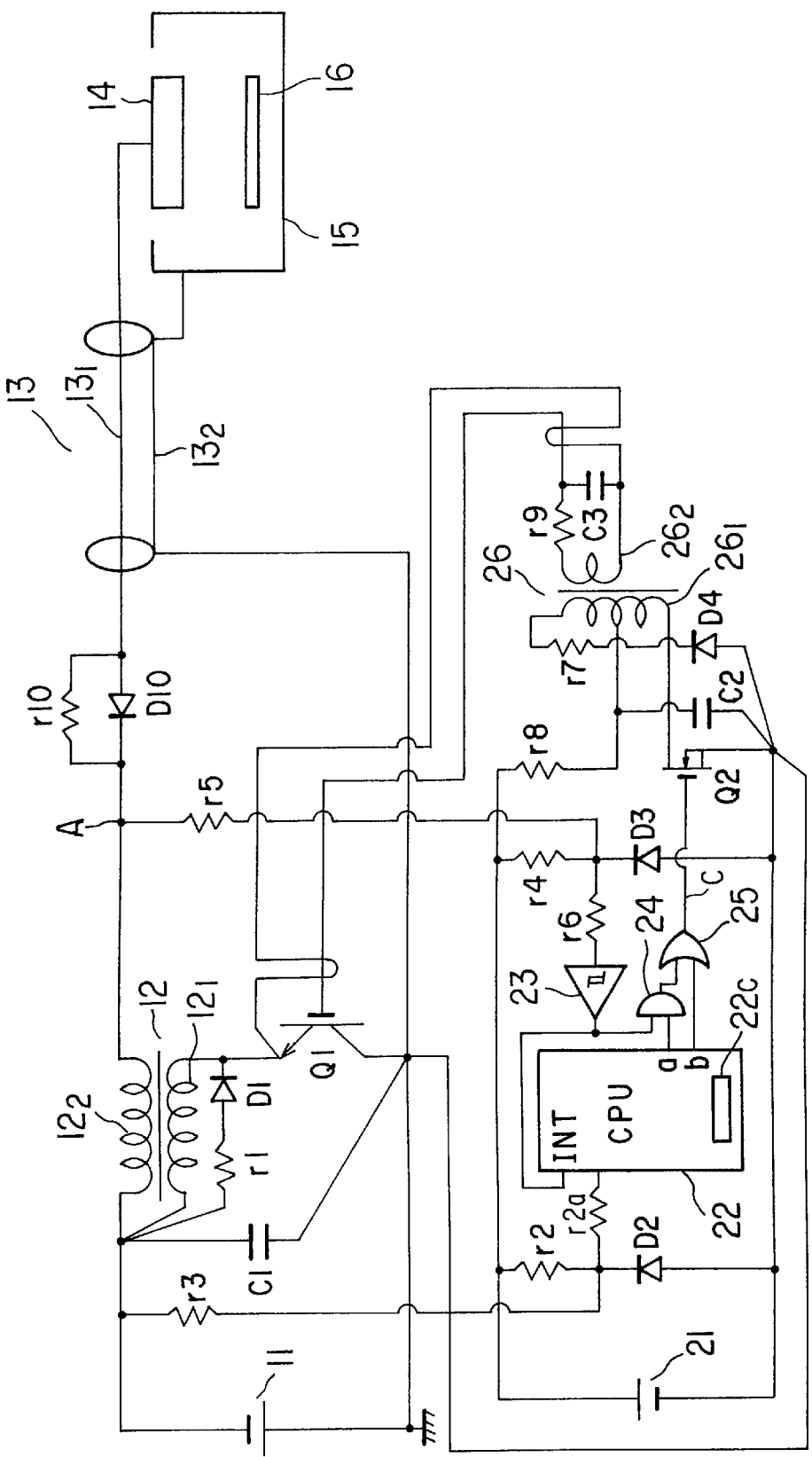
FIG. 3 is a circuit diagram showing a power supply device, for a sputtering apparatus, according to a second embodiment of the present invention.

With reference to FIG. 3 an explanation will be given below about a second embodiment of the present invention.

In the second embodiment, the same reference numerals are employed to designate parts corresponding to those shown in the first embodiment and any further explanation of them is, therefore, omitted.

In the second embodiment, between a point A of the first embodiment in FIG. 1 and the end of one line $13_1$ of an output cable 13, a diode D10 is connected in a way to have its anode connected to a line $13_1$ side and its cathode connected to a DC power supply 11 side. And a resistor r10 is bypassed to the diode D10 and connected in parallel to the diode D10. The remaining portion of the circuit is similar to that of the first embodiment. Further, the resistor r10 is about 100 [Ω] for example as will be set out below.

By connecting the diode D10 and resistor r10 as the parallel circuit a magnetron discharge is generated in a vacuum container 15 and sputtering is carried out. In this case, a current resulting from the magnetron discharge flows in a forward direction (from the anode to the cathode) of the diode D10 and no adverse effect occurs from a resistor r10.

As explained in connection with the first embodiment, the resistor r10 is provided, assuming that when a reverse voltage pulse is applied so as to set the sputtering source 14 to a positive potential, a reverse arc discharge occurs from a vacuum chamber 15 toward a sputtering source 14.

The generation of the reverse arc discharge is suppressed by the resistor r10. In the case where the voltage of a DC power source 11 is, for example, 800V, a voltage on the sputtering source 14 when a reverse voltage pulse is applied becomes 0.1E (80V). When the resistor is 100 Ω at that voltage of 80V, only a current of 0.8A flows and it is possible to suppress the generation of an arc discharge resulting from the application of the reverse voltage pulse. This is also evident from the ordinary load characteristic of the arc discharge.

Figure 4:
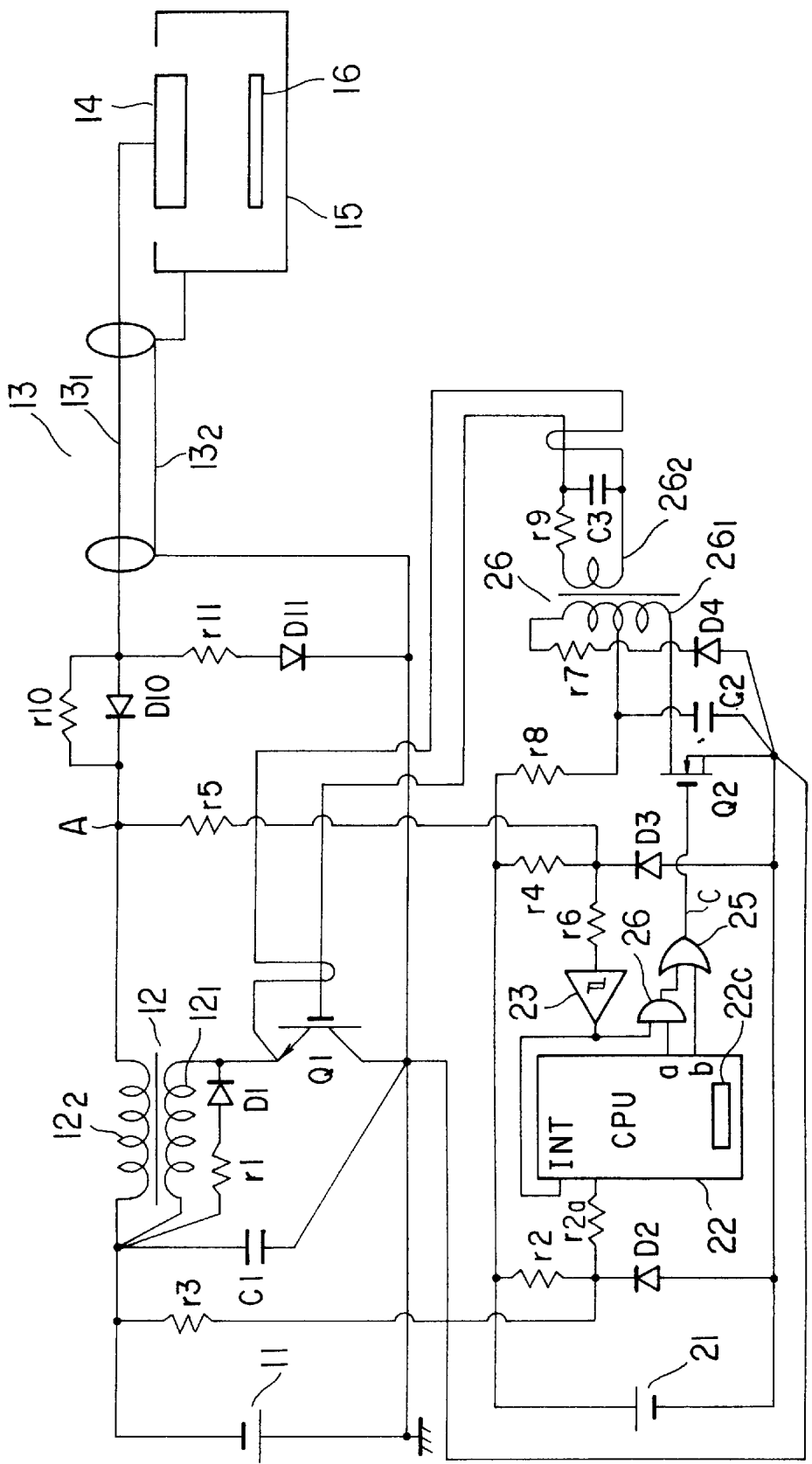
FIG. 4 is a circuit diagram showing a power supply device, for a sputtering apparatus, according to a third embodiment of the present invention.

With reference to FIG. 4, an explanation will be given below of a third embodiment of the present invention. In the third embodiment, between the anode of a diode D10 and the collector of a transistor Q1 in the circuit of FIG. 3, only a series-connected circuit of a resistor r11 and diode D11 is connected and a remaining circuit portion of the third embodiment is similar to that of FIG. 3.

As set out above, by providing the resistor r11 and diode D11 it is possible to lower a reverse voltage applied to a sputtering source 14 when a reverse voltage pulse is applied and it is possible to suppress the generation of a reverse arc discharge.

In the explanation of the first to third embodiments, although a gate control signal a is set to a "1" level in 5 μs from after the falling of the reverse voltage pulse, it may be within 1 to 10 μs. Further, this time is optimally within 2 to 5 μs. If "forming" sputtering is done with the use of a circuit in the above-mentioned embodiment, an arc discharge occurs at a substantially predetermined period and it is completely blocked, there being no problem in handling an arc discharge. However, the target is worn out and the arc discharge generation period varies depending upon the process conditions. This causes a variation in the sputtering's electric power and involves an inconvenience in process reproducibility.

When, irrespective of the detection of an arc discharge, a reverse voltage pulse is applied at a shorter period than the generation of the arc discharge, the ratio of the blocking time and sputtering time becomes constant and the process becomes stable.

Although, in the above-mentioned embodiment, the pulse transformer 12 has been explained as being used as a reverse voltage generating means, an autotransformer may be used.

(Advantages of the Present Invention)

According to the invention as claimed in claim 1, the application interval of a reverse voltage pulse is set to a time interval of below 1 to 10 μs at the arc discharge detection time, the generation probability of the continuous arc discharge can be extremely lowered.

According to the invention as claimed in claims 2 and 3, when a reverse voltage pulse is applied, a reverse impedance greater than, or parallel to, a normal impedance is provided so as to suppress an arc discharge current when a reverse arc discharge is generated. And it is possible to suppress the generation of the reverse arc discharge and hence to extremely lower the probability of generating a continuous arc discharge.

According to the invention as claimed in claim 4, since, when a reverse voltage pulse is applied, a current flowing on the vacuum chamber (sputtering source) side and current flowing on the diode D11 can be adjusted by the resistor r11, it is possible to prevent the substrate from being damaged by the arc discharge.

According to the present invention as claimed in claims 5 and 6, since the turn ratio of the transformer is set to 1:1 to 1:1.3 a reverse voltage pulse of 0.1 to 0.3 times that of the DC power supply can be output from the transformer.

According to the invention as claimed in claim 7 of the present application, the magnetic saturation of the transformer generating a reverse voltage pulse can cease to exist by designing a voltage·time product of the transformer generating the reverse voltage pulse to be four pulses or more and it is possible to prevent any uncontrollable state involved.

We claim:

1. In a sputtering apparatus introducing an inert gas into a grounded vacuum chamber, applying a negative voltage to a sputtering source located in the vacuum chamber and effecting sputtering, a power supply device for the sputtering apparatus which is characterized by comprising:

a DC current power supply for applying a DC voltage to the sputtering source;

reverse voltage generating means for generating and applying a reverse voltage to the sputtering source so as to stop generation of an arc discharge in the sputtering;

arc discharge detecting means for detecting the generation of the arc discharge in the vacuum chamber by detecting a voltage which exceeds a selected voltage on a line coupled to the sputtering source; and reverse voltage application control means for switching between the application of said DC voltage and the application of the reverse voltage to the sputtering source such that the reverse voltage is only switched to be applied if a voltage exceeding the selected voltage is detected by the arc discharge detecting means and switching to the application of said DC voltage has not occurred in an immediately preceding selected time period in a range of 1 to 10 µs.

2. A power supply device according to claim 1, characterized by further comprising a reverse arc discharge preventing circuit having:

a forward impedance connected between the reverse voltage generating means and the sputtering source in a direction to flow a current of a sputtering discharge; and a reverse impedance, connected to a reverse impedance greater than, and in parallel with, the forward impedance, for preventing generation of a reverse arc discharge.

3. A power supply device according to claim 2, characterized in that, in the reverse arc discharge preventing circuit, the forward impedance is provided by a diode and the reverse impedance is provided by a resistor.

4. A power supply device according to claim 3, characterized in that the reverse voltage generating means is comprised of a pulse transformer with a primary side connected to the DC power supply and a secondary side connected to the sputtering source and a turn ratio of the primary and secondary sides of the pulse transformer is 1:1 to 1:1.3.

5. A power supply device according to claim 4, characterized in that generation of a continuous arc discharge of over 2 pulses ceases to exist in the vacuum chamber through a reverse arc discharge preventing circuit and, by setting a voltage·time product of the pulse transformer of the reverse voltage generating means to be over 4 pulses, the pulse transformer secures the pulse transformer from being magnetically saturated.

6. A power supply device according to claim 3, characterized in that the reverse voltage generating means is comprised of an autotransformer with a primary side connected to the DC power supply and a secondary side connected to the sputtering source and a turn ratio of the primary side and secondary side in the autotransformer is 1:1.1 to 1.3.

7. A power supply device according to claim 6, characterized in that generation of a continuous arc discharge of over 2 pulses ceases to exist in the vacuum chamber through a reverse arc discharge preventing circuit and, by setting a voltage·time product of the autotransformer of the reverse voltage generating means to be over 4 pulses, the autotransformer secures the transformer from being magnetically saturated.

8. A power supply device according to claim 3, characterized in that generation of a continuous arc discharge of over 2 pulses ceases to exist in the vacuum chamber through a reverse arc discharge preventing circuit and, by setting a voltage·time product of a transformer of the reverse voltage generating means to be over 4 pulses, the transformer secures the transformer from being magnetically saturated.

9. A power supply device according to claim 2, characterized in that, between a sputtering source side of the reverse arc discharge preventing circuit and a positive polarity side of the DC power supply, a series circuit of a second diode and resistor is provided, the second diode being connected to flow a current from an anode side thereof toward the positive polarity side of the DC power.

10. A power supply device according to claim 9, characterized in that the reverse voltage generating means is comprised of a pulse transformer with a primary side connected to the DC power supply and a secondary side connected to the sputtering source and a turn ratio of the primary and secondary sides of the pulse transformer is 1:1 to 1:1.3.

11. A power supply device according to claim 10, characterized in that generation of a continuous arc discharge of over 2 pulses ceases to exist in the vacuum chamber through a reverse arc discharge preventing circuit and, by setting a voltage·time product of the autotransformer of the reverse voltage generating means to be over 4 pulses, the autotransformer secures the transformer from being magnetically saturated.

12. A power supply device according to claim 9, characterized in that the reverse voltage generating means is comprised of an autotransformer with a primary side connected to the DC power supply and a secondary side connected to the sputtering source and a turn ratio of the primary side and secondary side in the autotransformer is 1:1.1 to 1.3.

13. A power supply device according to claim 12, characterized in that generation of a continuous arc discharge of over 2 pulses ceases to exist in the vacuum chamber through a reverse arc discharge preventing circuit and, by setting a voltage·time product of the autotransformer of the reverse voltage generating means to be over 4 pulses, the autotrasformer secures the autotransformer from being magnetically saturated.

14. A power supply device according to claim 9, characterized in that generation of a continuous arc discharge of over 2 pulses ceases to exist in the vacuum chamber through a reverse arc discharge preventing circuit and, by setting a voltage·time product of a transformer of the reverse voltage generating means to be over 4 pulses, the transformer secures the transformer from being magnetically saturated.

15. A power supply device according to claim 1, characterized in that the reverse voltage generating means is comprised of a pulse transformer with a primary side connected to the DC power supply and a secondary side connected to the sputtering source and a turn ratio of the primary and secondary sides of the pulse transformer is 1:1 to 1:1.3.

16. A power supply device according to claim 15, characterized in that generation of a continuous arc discharge of over 2 pulses ceases to exist in the vacuum chamber through a reverse arc discharge preventing circuit and, by setting a voltage·time product of the pulse transformer of the reverse voltage generating means to be over 4 pulses, the pulse transformer secures the pulse transformer from being magnetically saturated.

17. A power supply device according to claim 1, characterized in that the reverse voltage generating means is comprised of an autotransformer with a primary side connected to the DC power supply and a secondary side connected to the sputtering source and a turn ratio of the primary side and secondary side in the autotransformer is 1:1.1 to 1.3.

18. A power supply device according to claim 17, characterized in that generation of a continuous arc discharge of over 2 pulses ceases to exist in the vacuum chamber through a reverse arc discharge preventing circuit and, by setting a voltage·time product of the autotransformer of the reverse voltage generating means to be over 4 pulses, the autotransformer secures the autotransformer from being magnetically saturated.

19. A power supply device according to claim 2, characterized in that the reverse voltage generating means is comprised of a pulse transformer with a primary side connected to the DC power supply and a secondary side connected to the sputtering source and a turn ratio of the primary and secondary sides of the pulse transformer is 1:1 to 1:1.3.

20. A power supply device according to claim 19, characterized in that generation of a continuous arc discharge of over 2 pulses ceases to exist in the vacuum chamber through a reverse arc discharge preventing circuit and, by setting a voltage·time product of the pulse transformer of the reverse voltage generating means to be over 4 pulses, the pulse transformer secures the pulse transformer from being magnetically saturated.

21. A power supply device according to claim 2, characterized in that the reverse voltage generating means is comprised of an autotransformer with a primary side connected to the DC power supply and a secondary side connected to the sputtering source and a turn ratio of the primary side and secondary side in the autotransformer is 1:1.1 to 1.3.

22. A power supply device according to claim 21, characterized in that generation of a continuous arc discharge of over 2 pulses ceases to exist in the vacuum chamber through a reverse arc discharge preventing circuit and, by setting a voltage·time product of the autotransformer of the reverse voltage generating means to be over 4 pulses, the autotransformer secures the transformer from being magnetically saturated.

23. A power supply device according to claim 2, characterized in that generation of a continuous arc discharge of over 2 pulses ceases to exist in the vacuum chamber through a reverse arc discharge preventing circuit and, by setting a voltage·time product of the transformer of the reverse voltage generating means to be over 4 pulses, the transformer secures the transformer from being magnetically saturated.

* * * * *